(12) United States Patent
Tsushima

(10) Patent No.: US 7,951,467 B2
(45) Date of Patent: May 31, 2011

(54) CLADDING MATERIAL AND ITS MANUFACTURING METHOD, PRESS-FORMING METHOD, AND HEAT SINK USING CLADDING MATERIAL

(76) Inventor: Eiki Tsushima, Shizuoka (JP)

( * ) Notice: Subject to any disclaimer, the term of this patent is extended or adjusted under 35 U.S.C. 154(b) by 520 days.

(21) Appl. No.: 12/083,774

(22) PCT Filed: May 25, 2006

(86) PCT No.: PCT/JP2006/310441
§ 371 (c)(1),
(2), (4) Date: Apr. 18, 2008

(87) PCT Pub. No.: WO2007/046164
PCT Pub. Date: Apr. 26, 2007

(65) Prior Publication Data
US 2009/0258248 A1 Oct. 15, 2009

(30) Foreign Application Priority Data
Oct. 18, 2005 (JP) ................. 2005-302590

(51) Int. Cl.
*B32B 15/01* (2006.01)
*H01L 23/36* (2006.01)
*B23K 20/00* (2006.01)

(52) U.S. Cl. ......... 428/635; 428/660; 428/674; 228/190

(58) Field of Classification Search ................. None
See application file for complete search history.

(56) References Cited

U.S. PATENT DOCUMENTS

| | | | |
|---|---|---|---|
| 2,462,085 A * | 2/1949 | Fremlin | 315/5.44 |
| 3,512,946 A * | 5/1970 | Hutkin | 428/612 |
| 4,025,997 A | 5/1977 | Gernitis et al. | |
| 4,454,495 A * | 6/1984 | Werner et al. | 338/195 |
| 4,950,554 A | 8/1990 | Fusco | |
| 5,156,923 A | 10/1992 | Jha et al. | |
| 5,358,795 A * | 10/1994 | Nakamura et al. | 428/614 |
| 6,129,993 A | 10/2000 | Kumamoto et al. | |
| 2005/0103637 A1* | 5/2005 | Yamasaki et al. | 205/170 |
| 2005/0112295 A1* | 5/2005 | Grechanyuk | 427/592 |
| 2006/0091552 A1* | 5/2006 | Breit et al. | 257/762 |
| 2010/0059271 A1* | 3/2010 | Yoneda et al. | 174/548 |

FOREIGN PATENT DOCUMENTS

| | | | |
|---|---|---|---|
| DE | 19605302 | * | 8/1997 |
| JP | 50-3871 | * | 2/1975 |
| JP | 60239033 | | 11/1985 |
| JP | 63-183188 | * | 7/1988 |
| JP | 02-102551 | | 4/1990 |

(Continued)

*Primary Examiner* — John J Zimmerman
(74) *Attorney, Agent, or Firm* — Paul F. Neils, Esq.; Akerman Senterfitt

(57) ABSTRACT

Recent semiconductor device becomes high powered, and on the material of heat sinks on which these devices are mounted, lower thermal expansion coefficient and higher thermal conductivity are needed. For this requirement, material with thermal conductivity as high as Cu alone and also with low thermal expansion coefficient, is needed. An aspect in accordance with the present invention provides, a cladding material in which 1st material layer and 2nd material layer are laminated alternately, wherein thermal expansion coefficient of said 2nd material is lower than the thermal expansion coefficient of said 1st material, and thermal conductivity of said 2nd material is lower than the thermal conductivity of said 1st material, and a total number of laminated layers composed of said 1st material and said 2nd material is 5 or more.

7 Claims, 6 Drawing Sheets

FOREIGN PATENT DOCUMENTS

| | | |
|---|---|---|
| JP | 03218054 | 9/1991 |
| JP | 05-317906 | 3/1993 |
| JP | 05-226527 | 9/1993 |
| JP | 06-47443 | 2/1994 |
| JP | 06-268115 | 9/1994 |
| JP | 06-268117 | 9/1994 |
| JP | 09-001361 | 1/1997 |
| JP | 2000286358 | 10/2000 |
| JP | 2002-314186 | * 10/2002 |
| JP | 2003-124410 | 4/2003 |
| JP | 2004-249589 | 9/2004 |
| WO | WO 2006/050205 A2 | 5/2006 |

* cited by examiner

CLADDING MATERIAL AND ITS MANUFACTURING METHOD, PRESS-FORMING METHOD, AND HEAT SINK USING CLADDING MATERIAL

CROSS-REFERENCE TO RELATED APPLICATIONS

The present application is a 35 U.S.C. 371 national stage entry of PCT/JP2006/310441, filed May 25, 2006, and claims priority from Japanese Patent Application No. 2005-302590, filed Oct. 18, 2005, the contents of which are herein incorporated by reference in their entirety.

BACKGROUND OF THE INVENTION

1. Field of the Invention

This invention relates to a heat sink material used for semiconductor devices, especially to a cladding material used for a heat sink on which LSIs, ICs, power transistors are mounted and are operated with high power, and also relates to its manufacturing method, to a press forming method for the cladding material, and to a heat sink using the cladding material.

2. Description of the Related Art

For heat sinks on which semiconductor devices, especially LSIs, ICs, power transistors operated with high power, are mounted, efficient dissipation of heat generated by these semiconductor devices is required.

Therefore, high mechanical strength and high thermal conductivity are required of these heat sinks. On the other hand, materials with low thermal expansion coefficient as lower than or equal to $6 \times 10^{-6}$/K, such as silicon which constitutes a semiconductor chip, ceramics material such as alumina which constitutes a semiconductor chip, or Kovar® etc., are bonded and used. Because this bonding temperature is about 850° C., when these are cooled after these materials are bonded so that no camber is made at this temperature, the heat sink will be contracted greatly compared with these bonded materials. Therefore, at room temperature, heat distortion or camber is generated in this heat sink. In order to reduce these, the thermal expansion coefficient of this heat sink is needed to nearly equal to that of bonded materials, or to be low.

Under these circumstances, single metal such as Cu (copper), Mo (molybdenum), and W (tungsten) etc., and composite metals such as Cu—W, and Cu—Mo etc., have been used as a material of the heat sink.

Among these materials, Cu has high thermal conductivity around 390 W/(m·K), although the thermal expansion coefficient of this is as high as $20 \times 10^{-6}$/K.

On the other hand, Mo and W have low thermal conductivity (Mo:$5 \times 10^{-6}$/K and W:$4 \times 10^{-6}$/K) respectively, although thermal expansion coefficient is lower, 142 W/(m·K) and 167 W/(m·K) respectively, compared with Cu. Therefore, the cladding material which is composed of lamination structure, in which a material such as Mo or W with low thermal expansion coefficient and with high thermal conductivity, and another material such as Cu is combined, is used.

For example, the Cu/Mo/Cu cladding material is shown in patent document 1 (JP,2-102551), A as a heat sink which consists of 3-layered structures. Here, by varying the volume ratio of Mo in the cladding material of this 3 layered structure in the range of 20% to 99.6%, then thermal conductivity and thermal expansion coefficient are controlled, and both higher thermal conductivity than Mo alone and lower thermal expansion coefficient than Cu alone, are obtained. In patent document 2 (JP, 6-268115,A), the relation between the thermal expansion coefficient of the cladding material with 3 layered structure of Cu/Mo/Cu and the volume ratio of Cu, is shown. In the cladding material of this composition, when the number of used Mo layer is one, in order to set the thermal expansion coefficient below $12 \times 10^{-6}$/K for example, the amount of used Mo with low thermal conductivity must be made higher than or equal to 20% of the whole mass. Therefore, the thermal conductivity in the thickness direction of this cladding material may be 230 W/(m·K) at most.

[Patent documents 1] JP,2002-201075,A
[Patent documents 2] JP,2005-26252,A

However, recent semiconductor device becomes high powered, and on the material of heat sinks on which these devices are mounted, low thermal expansion coefficient and higher thermal conductivity are needed. For this requirement, thermal conductivity of above mentioned cladding materials is not enough. Therefore, material with thermal conductivity as high as Cu alone and also with low thermal expansion coefficient, is needed.

In the above-mentioned cladding material, in order to make thermal expansion coefficient low, the volume ratio of Mo layer is needed to be lower than or equal to 20%. Mo is harder than Cu and hard to be patterned mechanically, therefore, the workability of the cladding material with large volume ratio of Mo gets worse, and fabrication using press punching method etc., which is suitable press forming method for mass production, is hard to be applied. Therefore, other press forming methods at high cost are required for this patterning, therefore, products using this cladding material becomes expensive. Therefore, it was difficult to obtain a cladding material with both high thermal conductivity and low thermal expansion coefficient at low cost.

This invention is made to solve these problems, and the purpose is to offer a cladding material which solves the above-mentioned problems, its manufacturing method, and a press forming method for the cladding material, and to offer a heat sink with both high thermal conductivity and low thermal expansion coefficient using this.

SUMMARY OF THE INVENTION

An aspect in accordance with the present invention provides, a cladding material in which 1st material layer and 2nd material layer are laminated alternately, wherein thermal expansion coefficient of said 2nd material is lower than the thermal expansion coefficient of said 1st material, and thermal conductivity of said 2nd material is lower than the thermal conductivity of said 1st material, and a total number of laminated layers composed of said 1st material and said 2nd material is 5 or more.

Moreover, in the cladding material of the present invention, volume ratio of said 2nd material in said cladding material is less than or equal to 10%.

Moreover, in the cladding material of the present invention, said 1st material is composed of copper (Cu), silver (Ag), alloy containing Cu, or alloy containing Ag.

Moreover, in the cladding material of the present invention, said 2nd material is composed of molybdenum (Mo) or tungsten (W).

Moreover, in the cladding material of the present invention, thermal conductivity of said cladding material at room temperature is higher than or equal to 200 W/(m·K).

Moreover, in the cladding material of the present invention, thermal expansion coefficient of said cladding material is lower than or equal to $14 \times 10^{-6}$/K.

Moreover, in the cladding material of the present invention, thermal conductivity of said cladding material at room temperature is higher than or equal to 200 W/(m·K).

Another aspect in accordance with the present invention provides, a manufacturing method of the cladding material in which 1st material layer and 2nd material layer are laminated alternately, comprising: laminating said 1st material layer and said 2nd material layer in order, bonding by hot uniaxial pressing method, in which applied pressure is higher than or equal to 50 kgf/cm² but lower than or equal to 150 kgf/cm², and temperature is higher than or equal to 850° C. but lower than or equal to 1000° C.

Moreover, in the manufacturing method of a cladding material, said bonding by uniaxial pressing method is carried in nitrogen atmosphere, in argon atmosphere, in helium atmosphere, or in vacuum.

Another aspect in accordance with the present invention provides, a press forming method for the cladding material, by which said cladding material is patterned, wherein said cladding material is patterned by press punching method.

Another aspect in accordance with the present invention provides, a heat sink made of said cladding material

EFFECT OF THE INVENTION

Since this invention is constituted as mentioned above, a cladding material with both high thermal conductivity and low thermal expansion coefficient can be obtained. This cladding material can be easily fabricated by the manufacturing method of this invention. Since this cladding material is excellent in workability, it can be easily patterned by the press forming method of this invention, and by these, a heat sink for semiconductor devices with excellent heat dissipation nature can be obtained at low cost.

DETAILED DESCRIPTION OF THE PREFERRED EMBODIMENTS

Hereafter, the best mode for carrying out this invention is explained.

In a cladding material of this invention, 1st material layer and 2nd material layer are laminated alternately, wherein thermal expansion coefficient of said 2nd material is lower than the thermal expansion coefficient in said 1st material, and thermal conductivity in said 2nd material is lower than the thermal conductivity in said 1st material, a total number of laminated layers composed of said 1st material and said 2nd material is 5 or more.

Figure 1:
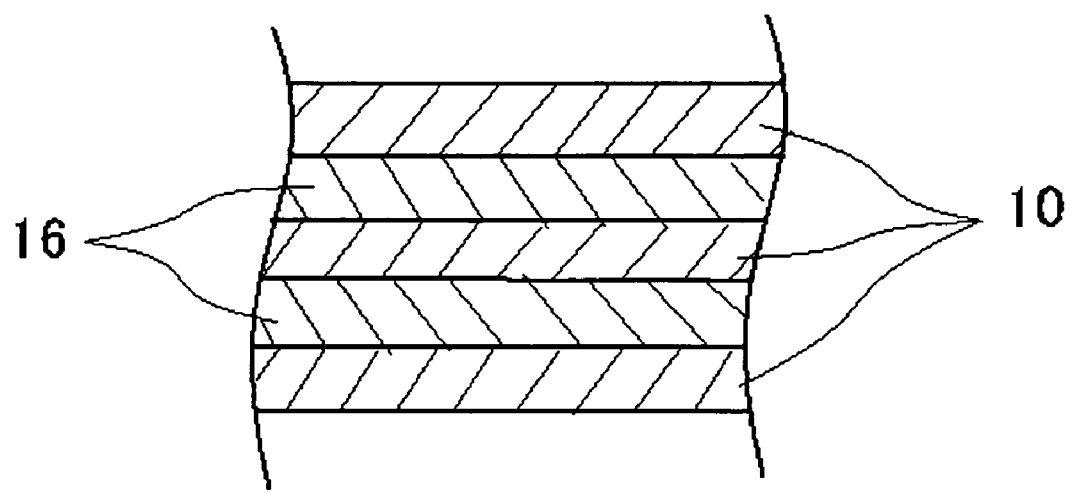
FIG. 1 shows a sectional view of the cladding material structure in an embodiment of the invention.

FIG. 1 is a sectional view showing the section structure of the cladding material of this invention. In the figure, the layer 10 is composed of 1st material, and the layer 20 is composed of 2nd material, and these layers are laminated alternatively. A total number of laminated layers is five or more (in this figure, this number is five).

Copper, silver, the alloy containing copper, or the alloy containing silver can be used as the 1st material with high thermal conductivity, for example.

Molybdenum or tungsten can be used as the 2nd material with lower thermal expansion coefficient than the 1st material, for example.

In the heat sink using this cladding material, since semiconductor chips are mounted on that surface, thermal conductivity along the vertical direction in FIG. 1 is important. Since thermal expansion causing the camber of the heat sink arises in the horizontal direction in FIG. 1, thermal expansion coefficient along the horizontal direction in FIG. 1 is important. Therefore, thermal conductivity and thermal expansion coefficient shall be set in these directions hereafter. Here, thermal conductivity is an amount defined by JISR1659-3, and thermal expansion coefficient is an amount defined by JISH7404.

The thermal conductivity of the cladding material of this invention is determined both by the total film thickness of the 1st material layer (sum total of the film thickness of the layer which consists of the 1st material), and by the total film thickness of the 2nd material (sum total of the film thickness of the layer which consists of the 2nd material). Therefore, if such total film thickness is equivalent, thermal conductivity will be equivalent irrespective of the number of laminated layers and of the composition. Because, the heat conduction arises in each layer independently, and does not affect the heat conduction in other layers.

On the other hand, even if the total film thickness of the 1st material layer and the total film thickness of the 2nd material layer are kept constant, the thermal expansion coefficient in the cladding material of this invention depends on the number of laminated layers or on the film thickness of each layer. Because, while each layer is expanding, thermal expansion of the layer is influenced by other layers adjoining vertically. When a layer which consists of the 1st material with higher thermal expansion coefficient is expanding thermally, this expansion is influenced by other layers adjoining upward or downward, which consists of the 2nd material with lower thermal expansion coefficient, therefore, stress is generated so that the thermal expansion is decreased. Therefore, the thermal expansion coefficient of the whole cladding material can be made low.

Thus, in this cladding material, the layer which consists of the 2nd material plays the role for making the thermal expansion coefficient low. Even if the total film thickness of the layer which consists of the 1st material and the total film thickness of the layer which consists of the 2nd material are kept constant, when thickness of each layers are small, or the number of the total layers is large, this effect becomes remarkable especially. Specifically, this effect becomes great when the number of total layers in this cladding material will be five or more. When the number is four or less, this effect becomes a little.

For the top layer or the bottom layer in this cladding material, since the adjoining layer exists only in one side, these layers are preferred to be composed of the 2nd material to make thermal expansion coefficient of this cladding material low. On the other hand, because bonding or plating is carried directly on these layers, Cu, which is the 1st material on which bonding or plating is carried easily, may be used also for these layers.

Since the 2nd material layer has lower thermal conductivity than the 1st material layer, when the total film thickness of the 2nd material layer becomes large, the thermal conductivity of this cladding material will become low. Therefore, unless the thermal expansion coefficient becomes large, the total film thickness of the 2nd material layer is preferred to be small. For the purpose, the volume ratio of the 2nd material layer to said cladding material is preferred to be 10% or less. When setting the ratio larger, although the thermal expansion coefficient becomes small, thermal conductivity becomes small.

For example, as the 1st material, copper (Cu) can be used preferably and molybdenum (Mo) can be preferably used as the 2nd material. In these materials, thermal expansion coefficient of Cu is $20 \times 10^{-6}$/K and that of Mo is $5 \times 10^{-6}$/K, and thermal conductivity of Cu is 390 W/(m·K) and that of Mo is 142 W/(m·K). However, a cladding material with thermal expansion coefficient of $14 \times 10^{-6}$/K or lower, and with thermal conductivity of 200 W/(m·K) or higher can be given.

And, thickness of each layer made of 2nd material is preferred to be less than or equal to 200 μm. If thicker layer than this exists, the patterning method of this cladding material using the press punching method mentioned later is inapplicable.

The mechanism by which thermal expansion coefficient becomes low in this cladding material is described based on experimental results below.

Figure 2:
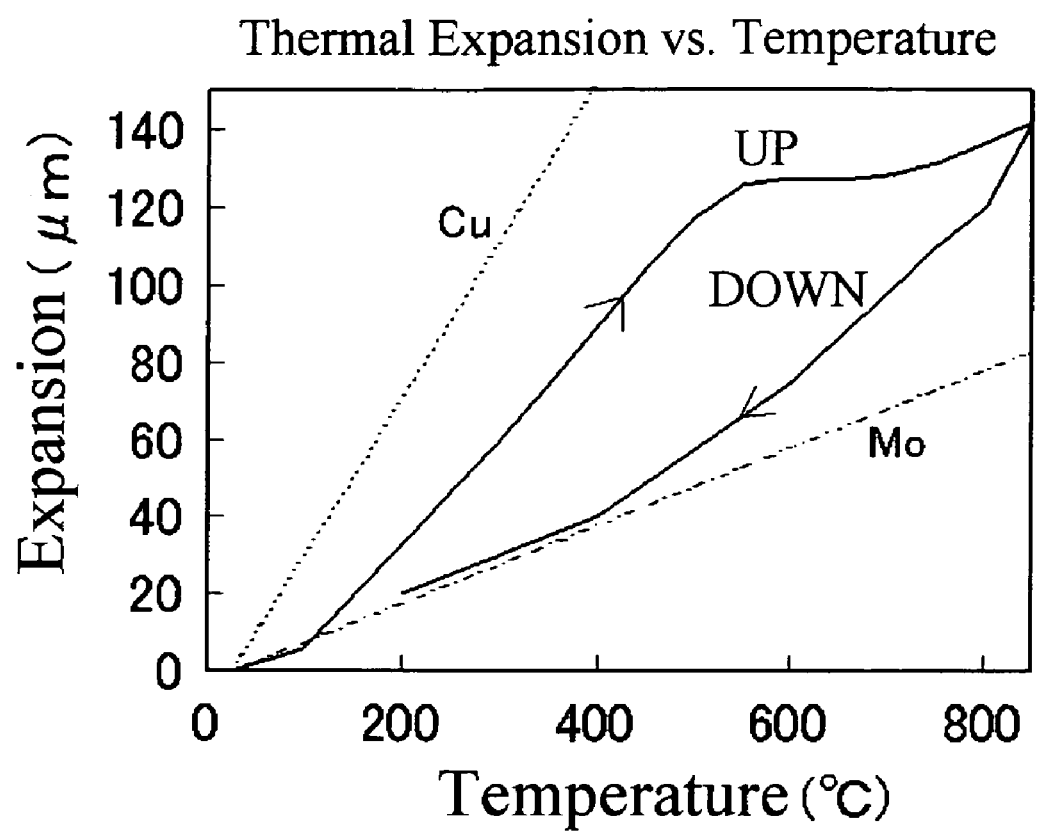
FIG. 2 shows measured results of relation between temperature and thermal expansion while heating and while cooling, on the cladding material in an embodiment of the invention.

FIG. 2 shows the measured results of relation between temperature and expansion of a sample (expansion of a sample whose length is 20.2 mm at 25° C.), composed of 7 layers in which Cu is used as the 1st material and Mo is used as the 2nd material, hereby, Cu(100 μm)/Mo(20 μm)/Cu(600 μm)/Mo(20 μm)/Cu(600 μm)/Mo(20 μm)/Cu(100 μm). In this example, the expansion while raising temperature from 25° C. to 850° C. and the expansion while falling temperature to 25° C. from 850° C. were measured. The temperature of 850° C. is almost equivalent to the temperature at which the heat sink is bonded using silver solder. Expansion of a sample made of Cu alone with the same size, and also expansion of another sample made of Mo alone with the same size, are also shown in the graph as references. The inclination in this graph corresponds to a thermal expansion coefficient. The expansion of this cladding material lies between that of Cu alone and that of Mo alone, however, two significant points can be seen in this relation, one is that the expansion of this material is saturated above 600° C. and the other one is that the expansion while the temperature is going up is different from that while the temperature is going down.

At first, the saturation of the expansion above 600° C. arises because Cu with softening temperature of around 500° C. softens. Up to 500° C., the thermal expansion of this cladding material is dominated by the thermal expansion of Cu layers, Mo layers are dragged by the thermal expansion of the Cu layers, and tensile stress is generated in Mo layers. After temperature rises and Cu softens above this temperature, the tensile stress generated in Mo layers are released suddenly, and the expansion becomes the same as that of Mo alone. Above this temperature, the expansion is dominated by the thermal expansion of Mo layers. Therefore, although the volume ratio of Mo layers in this cladding material is only 4.11%, the expansion of this cladding material at 850° C. may be closer to that of Mo alone, than that of Cu alone.

The characteristics while the temperature is going up are different from the characteristics while the temperature is going down, because Cu layers are softened at the starting temperature (850° C.) of the cooling process, and the thermal contraction while the temperature is going down is dominated by thermal contraction of Mo layers. At the aforementioned softening temperature or lower, the thermal contraction of Cu layers dominate the thermal contraction of the material. As mentioned above, linear characteristic is not seen while the temperature is going up, although linear characteristic can be seen while the temperature is going down.

As these measurements were carried while two or more heat cycles with a temperature range from room temperature to 850° C. were applied to this cladding material, it was verified that similar results were obtained within the errors of the measurements.

Therefore, the amount of expansion after the temperature was going up from 25° C. to 850° C., or the amount of contraction after the temperature was going down from 850° C. to 25° C., is close to that of Mo alone, although the volume ratio of Mo is small.

Therefore, after material with low thermal expansion coefficient such as silicon, alumina etc., is bonded by brazing filler at 850° C. to the heat sink made of the cladding material with these characteristics, the camber of the heat sink at room temperature after cooling will become little. Thermal conductivity is determined both by the total film thickness of Cu layers, and the total film thickness of Mo layers, as aforementioned. However, since the volume ratio of Mo layers in this cladding material is small, that thermal conductivity will become high and become close to that of Cu. Thereby, this cladding material have thermal expansion characteristic close to that of Mo, and have thermal conductivity close to that of Cu. A thermal expansion coefficient is computed from the inclinations of the graph in FIG. 2 here, and the characteristic while the temperature is going down, is directly related to the camber of the heat sink. Therefore, in the following, the value computed from the characteristic while the temperature is going down is shown as the thermal expansion coefficient of this cladding material.

Next, how to fabricate this cladding material is described.

Figure 3:
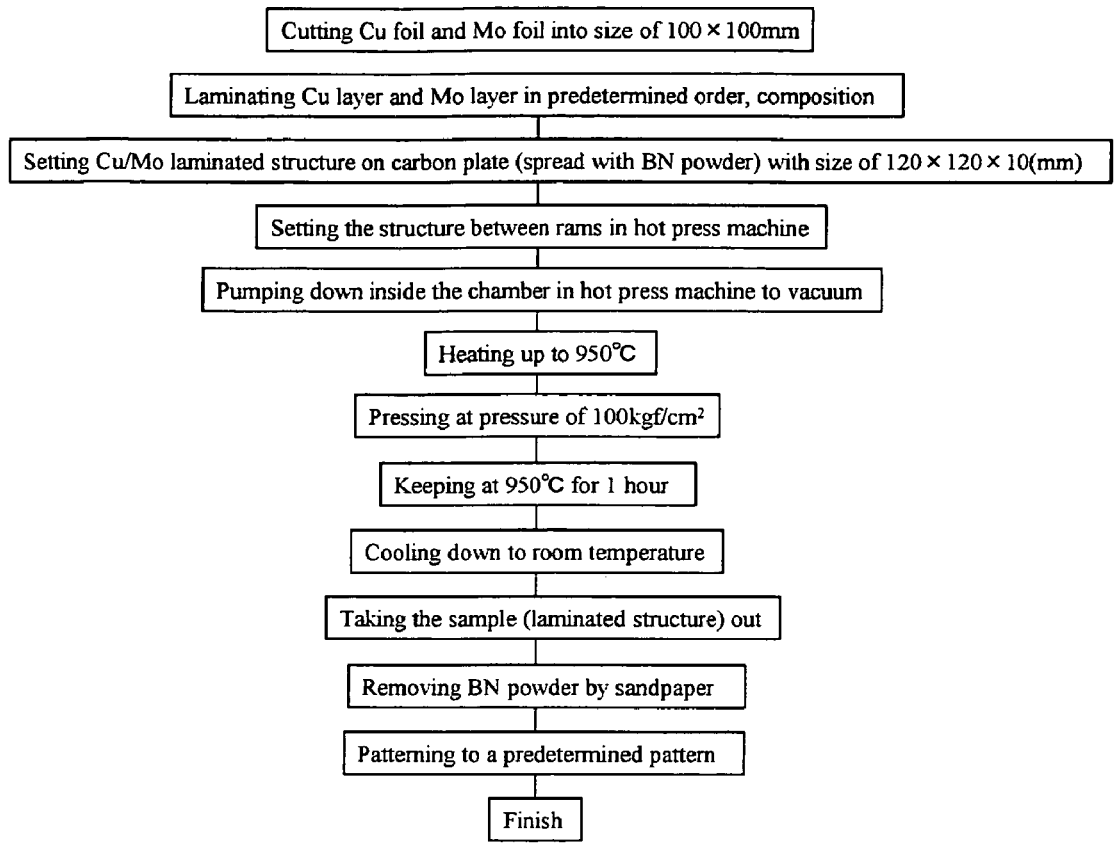
FIG. 3 shows a manufacturing method of the cladding material in an embodiment of the invention.

This cladding material is fabricated by hot uniaxial pressing method, in which 1st material layer or 2nd material layer is pressed at the pressure that is higher than or equal to 50 kgf/cm$^2$ but lower than or equal to 150 kgf/cm$^2$, and at temperature that is higher than or equal to 850° C. but lower than or equal to 1000° C. An example of this manufacturing method is shown in FIG. 3. In this example, the laminated sheet in which each layer with a predetermined thickness and with a predetermined composition is laminated in a predetermined order, is pressed at the temperature of 950° C. and at the pressure of 100 kgf/cm$^2$ in vacuum, and these layers are bonded mutually. This pressing is performed by the hot pressing machine.

According to this manufacturing method, this cladding material is formed by what is called hot pressing method in which 1st material layers or 2nd material layers both with a predetermined thickness are laminated and pressed at high temperature uniaxially. Then, when especially Cu is used as the 1st material, since Cu may be easily oxidized, the atmosphere is preferred to contain no oxygen. Therefore, it is preferred to perform the above process in a nitrogen atmosphere, argon atmosphere, helium atmosphere, or in vacuum.

In order to make the lamination easy, plating layer may be formed on the surface of each laminated layer, however the thermal conductivity is decreased by this plating layer, and plating layer is preferred to be formed. However, when this cladding material is used as a heat sink, other materials may be bonded to the top layer or to the bottom layer using a brazing filler or a solder, in this case, since this bonding can be easily performed on the plating layer, the plating layers are preferred to be formed on the surfaces of the top layer and of the bottom layer.

The temperature during the bonding process by hot uniaxial pressing method is preferred to be higher than or equal to 850° C. but lower than or equal to 1000° C. When this temperature is lower than 850° C., bonding strength becomes poor and the bonded layer may be peeled off. When Cu is especially used as the 1st material and this temperature is higher than 1000° C., Cu will be molten.

The given pressure used for the bonding by hot uniaxial pressing method may be preferred to be higher than or equal to 50 kgf/cm$^2$ but lower than or equal to 200 kgf/cm$^2$. When this pressure is lower than 50 kgf/cm$^2$, bonding strength becomes poor and the bonded layer may be peeled off. When Cu is especially used as the 1st material, and this pressure is higher than 200 kgf/cm$^2$, softened Cu extends greatly under the pressure, and it is hard to set the thickness at a predetermined value.

Next, the press forming method for this cladding material is described.

To pattern this cladding material, press punching method can be easily applied.

In order to fabricate a heat sink using the cladding material of this invention, it is necessary to pattern this cladding material as desired. Materials used as the 1st material such as Cu, Ag, or alloys containing these, have high thermal conductivity and high thermal expansion coefficient, and are mechanically soft and are very easy to be patterned mechanically. On the other hand, materials used as the 2nd material such as Mo or W, are mechanically hard and hard to be patterned mechanically. Therefore, the press punching method known as an easy patterning method can be applied to Cu or Ag, but can not be applied to Mo or W. Therefore, the cladding material in which these materials are laminated can be patterned more easily, as the volume ratio of the 2nd material is less. To the cladding material in which these materials are laminated, with the volume ratio of the 2nd material larger than 10%, this method cannot be applied. Also, even if thickness of only one of 2nd material layers exceeds 200 μm, this method cannot be applied.

In the cladding material of this invention, since the volume ratio of the 2nd material was set small as aforementioned and high thermal conductivity and low thermal expansion coefficient were obtained, volume ratio of the 2nd material can be made small, for example, less than or equal to 10%. Since thickness of every 2nd material layer can be made less than or equal to 200 μm, with high thermal conductivity, this cladding material can be easily patterned mechanically. Therefore, patterning method at low cost such as press punching method, can be applied. Thereby, the heat sink using the cladding material of this invention can be obtained at low cost.

Example

Below, examples of this invention are described with comparative examples.

As lamination structures composed of Cu and Mo as examples of this invention, the cladding materials in which the number of layers and the thickness of each layer were varied, were fabricated as examples 1-15. On the other hand, the cladding materials in which the thickness of each layer of the 3-layered structure of Cu/Mo/Cu was varied, were fabricated as comparative examples 1-15 as comparative examples. The thermal expansion coefficient and the thermal conductivity in these samples were measured. All examples and all comparative examples were fabricated by the manufacturing method shown in FIG. 3. The thermal expansion coefficients were calculated as averages while cooling from 850° C. to 30° C. in argon atmosphere, using Dilato Meter made by MAC Science co., ltd, by a procedure described in JISH7404. Each sample used for measurement of thermal expansion coefficient was made into the size of 20 mm (length)×3 mm (width). Thermal diffusivity specified in JISH7801 was measured by a laser flash measurement system made by Sinkuu Rikou co., ltd, average specific heat and average density were calculated from the volume ratio of Cu and Mo, and the thermal conductivity was calculated from these values by the method specified in JISR1650-3.

Each sample used for thermal conductivity measurement was cut from the sample fabricated with diameter of 10 mm. The usual thickness was set in the range of 1 mm to 3 mm, and was easily measured. Table 1 shows the volume ratio of Mo, thermal expansion coefficient, thickness of the cladding material, and composition of the laminated structure, of each example and comparative example. Here, on the composition and thickness of each layer, for example, "Cu(400)/((Mo(10)/Cu(200))(*3)/Mo(10)/Cu(400)" means a laminated structure "Cu(400 μm)/Mo(10 μm)/Cu(200 μm)/Mo(10 μm)/Cu(200 μm)/Mo(10 μm)/Cu(200 μm)/Mo(10 μm)/Cu(400 μm)".

TABLE 1

| Sample No. | Volume Ratio of Mo (%) | Thermal Expansion Coefficient ($10^{-6}$/K) | Total Thickness (μm) | Composition and Thickness (μm) of each layer |
|---|---|---|---|---|
| Example 1 | 2.78 | 13.40 | 1440 | Cu(400)/((Mo(10)/Cu(200))*3)/Mo(10)/Cu(400) |
| Example 2 | 7.58 | 8.10 | 1400 | Cu(300)/((Mo(20)/Cu(200))*4)/Mo(20)/Cu(300) |
| Example 3 | 2.10 | 17.70 | 2860 | Cu(400)/((Mo(10)/Cu(300))*2)/Mo(10)/Cu(800)/((Mo(10)/Cu(300))*2)/Mo(10)/Cu(400) |
| Example 4 | 6.67 | 8.40 | 3000 | Cu(300)/((Mo(20)/Cu(200))*4)/Mo(20)/Cu(600)/((Mo(20)/Cu(200))*4)/Mo(20)/Cu(300) |
| Example 5 | 7.59 | 8.40 | 2600 | Cu(400)/Mo(50)/Cu(400)/Mo(50)/Cu(800)/Mo(50)/Cu(400)/Mo(50)/Cu(400) |
| Example 6 | 5.71 | 8.10 | 1400 | Cu(210)/Mo(20)/Cu(300)/Mo(20)/Cu(300)/Mo(20)/Cu(300)/Mo(20)/Cu(210) |
| Example 7 | 7.14 | 8.50 | 1400 | Cu(400)/Mo(50)/Cu(500)/Mo(50)/Cu(400) |
| Example 8 | 4.26 | 10.50 | 1880 | (Cu(200)/Mo(10))*8)/Cu(200) |
| Example 9 | 4.00 | 10.80 | 1250 | (Cu(200)/Mo(10))*5)/Cu(200) |
| Example 10 | 2.78 | 14.00 | 1440 | Cu(400)/((Mo(10)/Cu(200))*3)/Mo(10)/Cu(400) |
| Example 11 | 4.11 | 10.65 | 1460 | Cu(400)/((Mo(20)/Cu(300))*2)/Mo(20)/Cu(400) |
| Example 12 | 5.88 | 7.55 | 1700 | Cu(200)/((Mo(20)/Cu(300))*4)/Mo(20)/Cu(200) |
| Example 13 | 4.11 | 11.80 | 1460 | Cu(600)/((Mo(20)/Cu(100))*2)/Mo(20)/Cu(600) |
| Example 14 | 4.11 | 10.35 | 1460 | Cu(100)/((Mo(20)/Cu(600))*2)/Mo(20)/Cu(100) |
| Example 15 | 7.70 | 8.40 | 1300 | Cu(400)/(Mo(50)/Cu(400))*2) |

TABLE 1-continued

| Sample No. | Volume Ratio of Mo (%) | Thermal Expansion Coefficient ($10^{-6}$/K)) | Total Thickness (μm) | Composition and Thickness (μm) of each layer |
|---|---|---|---|---|
| Comparative Example 1 | 1.00 | 19.61 | 2000 | Cu(990)/Mo(20)/Cu(990) |
| Comparative Example 2 | 2.00 | 19.23 | 2000 | Cu(980)/Mo(40)/Cu(980) |
| Comparative Example 3 | 3.00 | 18.86 | 2020 | Cu(980)/Mo(60)/Cu(980) |
| Comparative Example 4 | 4.00 | 18.51 | 2000 | Cu(960)/Mo(80)/Cu(960) |
| Comparative Example 5 | 5.00 | 18.17 | 2000 | Cu(950)/Mo(100)/Cu(950) |
| Comparative Example 6 | 6.00 | 17.83 | 1660 | Cu(780)/Mo(100)/Cu(780) |
| Comparative Example 7 | 8.00 | 17.20 | 1870 | Cu(860)/Mo(150)/Cu(860) |
| Comparative Example 8 | 10.00 | 16.59 | 2000 | Cu(900)/Mo(200)/Cu(900) |
| Comparative Example 9 | 15.00 | 15.23 | 2000 | Cu(850)/Mo(300)/Cu(850) |
| Comparative Example 10 | 20.00 | 14.04 | 2000 | Cu(800)/Mo(400)/Cu(800) |
| Comparative Example 11 | 30.00 | 12.05 | 2000 | Cu700( )/Mo(600)/Cu(700) |
| Comparative Example 12 | 40.00 | 10.46 | 2000 | Cu(600)/Mo(800)/Cu(600) |
| Comparative Example 13 | 50.00 | 9.16 | 2000 | Cu(500)/Mo(1000)/Cu(500) |
| Comparative Example 14 | 60.00 | 8.08 | 2000 | Cu400( )/Mo(1200)/Cu(400) |
| Comparative Example 15 | 80.00 | 6.38 | 2000 | Cu(200)/Mo(1600)/Cu200( ) |

Figure 4:
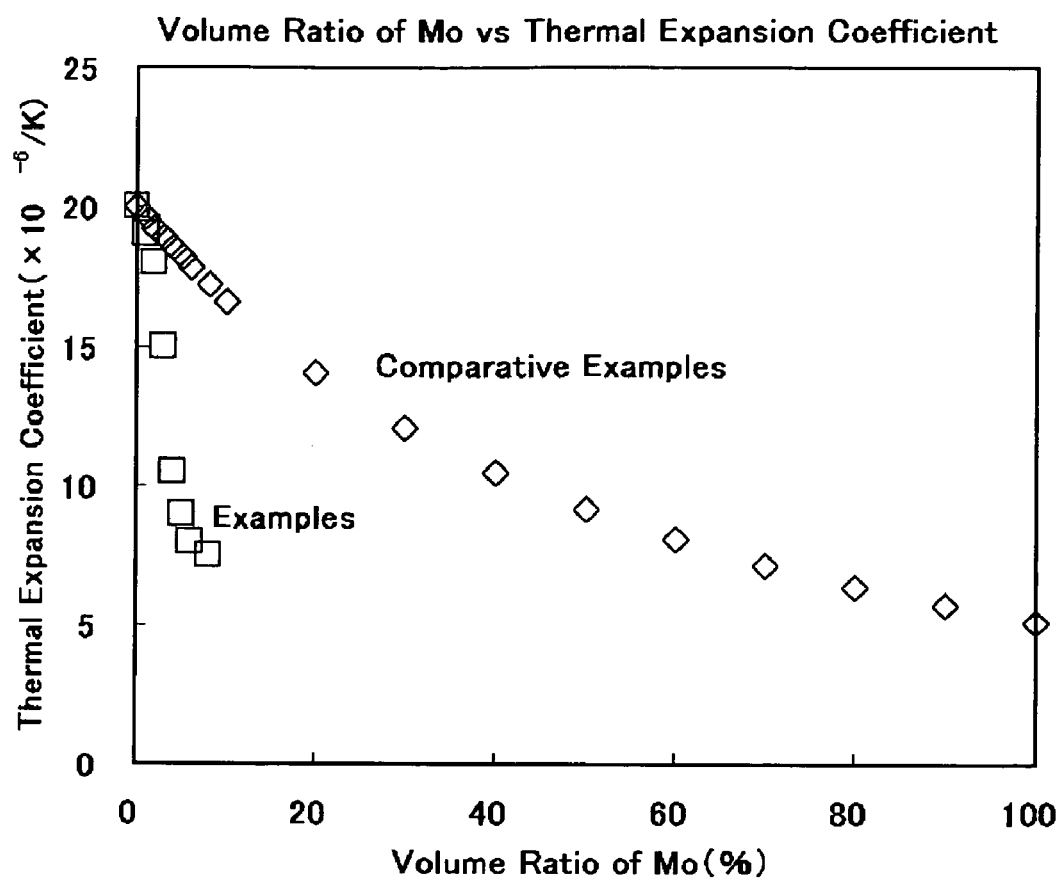
FIG. 4 shows a relation between volume ratio of Mo and thermal expansion coefficient, in the examples of this invention and in the comparative examples.

All examples have volume ratio of Mo less than or equal to 10%, although they have lower thermal expansion coefficient than comparative example 8 that have volume ratio of Mo of 10%. FIG. 4 shows the relation between volume ratio of Mo and thermal expansion coefficient, on the results shown in Table 1. The examples of this invention have lower thermal expansion coefficient, than comparative examples that have same volume ratio of Mo, or equivalent thermal expansion coefficient can be obtained with smaller volume ratio of Mo.

Figure 5:
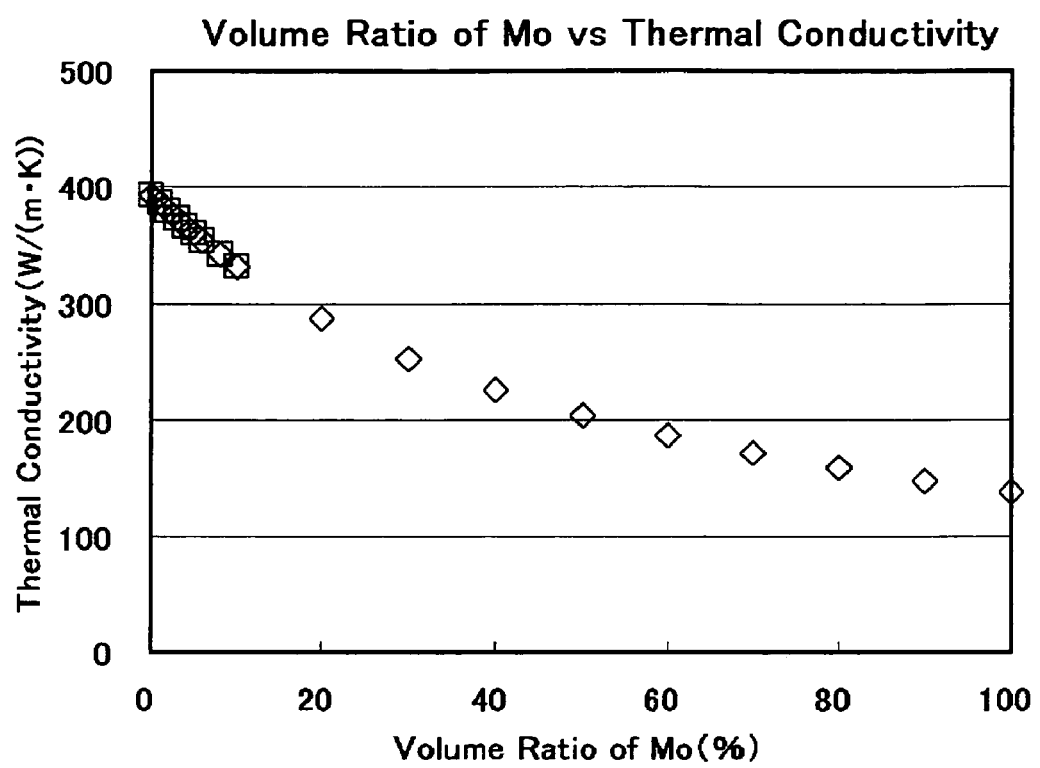
FIG. 5 shows a relation between volume ratio of Mo and thermal conductivity, in the examples of this invention and in the comparative examples.
Figure 6:
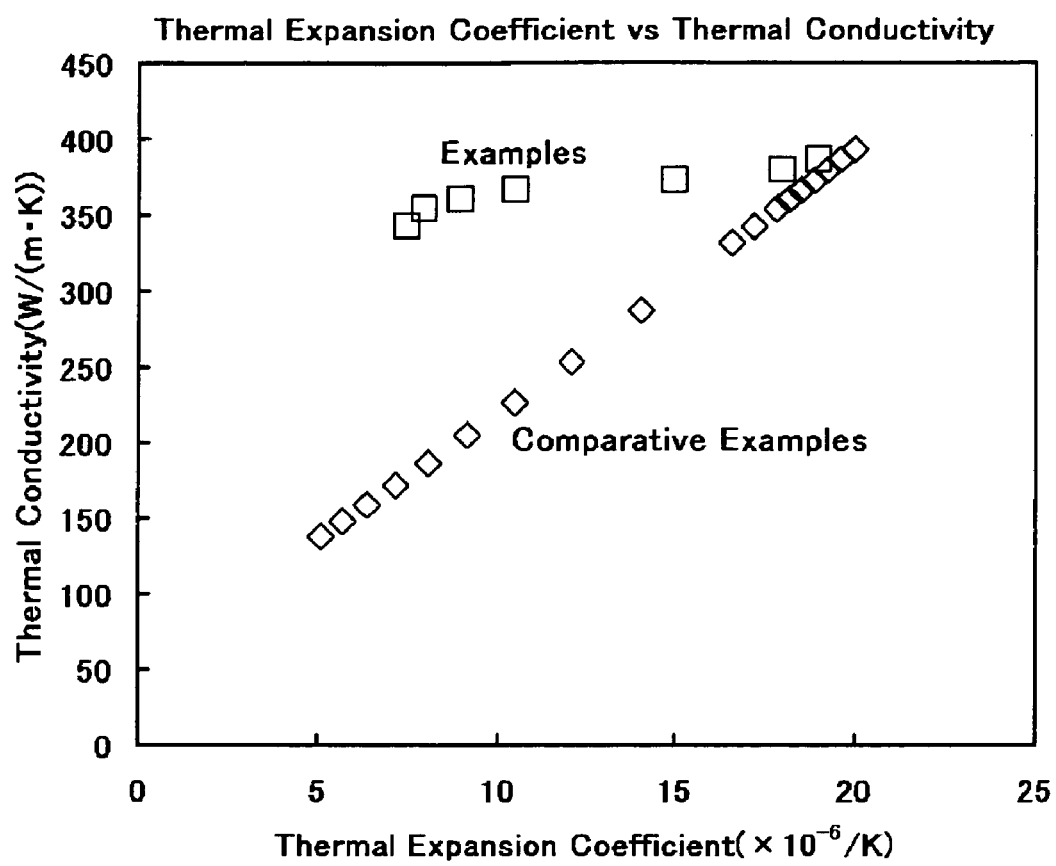
FIG. 6 shows a relation between thermal expansion coefficient and thermal conductivity in the examples of this invention and in the comparative examples.

FIG. 5 shows the relation between volume ratio of Mo and thermal conductivity on the results shown in Table 1. In the region where volume ratio of Mo is less than or equal to 10%, results of the examples and those of the comparative examples are equivalent. Therefore, it is confirmed that if volume ratio of Mo is equivalent, thermal conductivity is equivalent on the examples of this invention and on the comparative examples. Thereby, thermal conductivity is determined only by volume ratio of Mo, irrespective of the composition of each layer, even if the number of laminated layers is more than or equal to five, similarly as the number is less than or equal to three. FIG. 6 shows the relation between thermal expansion coefficient and thermal conductivity. In the examples of this invention, higher thermal conductivity and lower thermal expansion coefficient are obtained, compared with the comparative examples. Especially by this invention, the cladding material with thermal expansion coefficient lower than or equal to $14 \times 10^{-6}$/K and with thermal conductivity higher than or equal to 200 W/(m·K) at room temperature, can be obtained.

To the heat sink with size of 24 mm×17.4 mm, which consists of the cladding material with same composition as example 9, a frame made of Kovar® was bonded using silver brazing at 850° C. The camber of this heat sink after cooling at room temperature was measured by laser displacement measurement machine TK-111 and LT-987 made by KEYENCE CORP. As a result, the amount of camber in the diagonal of this heat sink was as small as 5 μm, and the validity of this invention was confirmed.

Next, the example of manufacturing method of this invention is described.

Table 2 shows the results on whether the laminated layer was peeled or not after the fabrication in samples with laminated structure of Cu/Mo, made by the manufacturing method shown in FIG. 3, in which both applied pressure and temperature of the hot uniaxial pressing method, are varied.

TABLE 2

| Temperature | Pressure (kgf/cm²) | | | | | | |
|---|---|---|---|---|---|---|---|
| (°C.) | 50 | 100 | 150 | 200 | 400 | 500 | 1000 |
| 1000 | ○ | ○ | ○ | x | x | x | x |
| 950 | ○ | ○ (the most suitable) | ○ | ○ | x | x | x |
| 900 | ○ | ○ | ○ | ○ | ○ | x | x |
| 850 | ○ | ○ | ○ | ○ | ○ | ○ | x |
| 800 | x | x | x | x | x | x | x |
| 750 | x | x | x | x | x | x | x |
| 700 | x | x | x | x | x | x | x |
| 650 | x | x | x | x | x | x | x |
| 600 | x | x | x | x | x | x | x |
| 550 | x | x | x | x | x | x | x |

In Table 2, "○" corresponds to the sample with firm bonding strength, and "X" corresponds to the sample in which the layer was peeled, in the peel test after that. When the applied pressure is higher than or equal to 50 kgf/cm² but lower than or equal to 200 kgf/cm², and the temperature is higher than or equal to 850° C. but lower than or equal to 1000° C., excellent cladding materials were obtained.

What is claimed is:

1. A cladding material in which a planar copper (Cu) layer and a planar molybdenum (Mo) layer are laminated alternately, wherein a total number of laminated Cu layers and laminated Mo layers in said cladding material is 5 or more, a volume ratio of said Mo layers in said cladding material is in the range of 2.78% to 10%, and a thickness of every Mo layer in said cladding material is less than or equal to 200 μm.

2. The cladding material according to claim 1, wherein a thermal conductivity of said cladding material at room temperature is higher than or equal to 200 W/(m·K).

3. The cladding material according to claim 1, wherein a thermal expansion coefficient of said cladding material is lower than or equal to $14 \times 10^{-6}$/K.

4. A method of manufacturing the cladding material according to claim 1, comprising;

laminating said Cu layer and said Mo layer in order, setting the volume ratio of said Mo layers in said cladding material to be less than or equal to 10%, bonding by hot uniaxial pressing method, in which applied pressure is higher than or equal to 50 kgf/cm$^2$ but lower than or equal to 150 kgf/cm$^2$, and temperature is higher than or equal to 850° C. but lower than or equal to 1000° C.

5. The method of manufacturing a cladding material according to claim 4, wherein said bonding by uniaxial pressing method is carried out in a nitrogen atmosphere, in an argon atmosphere, in a helium atmosphere, or in a vacuum.

6. A press forming method for the cladding material, by which the cladding material according to claim 1 is patterned, wherein said cladding material is patterned by a press punching method.

7. A heat sink made of the cladding material according to claim 1.

* * * * *